(12) United States Patent
Fujiwara et al.

(10) Patent No.: US 11,908,545 B2
(45) Date of Patent: Feb. 20, 2024

(54) MEMORY DEVICE AND OPERATING METHOD FOR COMPUTING-IN-MEMORY

(71) Applicant: Taiwan Semiconductor Manufacturing Company, Ltd., Hsinchu (TW)

(72) Inventors: Hidehiro Fujiwara, Hsin-Chu (TW); Haruki Mori, Hsinchu (TW); Wei-Chang Zhao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 31 days.

(21) Appl. No.: 17/679,118

(22) Filed: Feb. 24, 2022

(65) Prior Publication Data
US 2023/0267979 A1 Aug. 24, 2023

(51) Int. Cl.
G11C 7/22 (2006.01)
G11C 7/10 (2006.01)
G06F 7/544 (2006.01)
G11C 7/12 (2006.01)

(52) U.S. Cl.
CPC .......... G11C 7/222 (2013.01); G06F 7/5443 (2013.01); G11C 7/106 (2013.01); G11C 7/1087 (2013.01); G11C 7/12 (2013.01)

(58) Field of Classification Search
CPC ....... G11C 7/222; G11C 7/106; G11C 7/1087; G11C 7/12; G06F 7/5443
See application file for complete search history.

(56) References Cited

U.S. PATENT DOCUMENTS

2021/0382690 A1* 12/2021 Lo ............................ G06N 3/04
2023/0025899 A1* 1/2023 Song ..................... G06F 7/5443
2023/0047364 A1* 2/2023 Badaroglu ................ G06F 7/50

* cited by examiner

Primary Examiner — Ajay Ojha
(74) Attorney, Agent, or Firm — JCIPRNET

(57) ABSTRACT

A memory device and an operating method for computing-in-memory (CIM) are provided. The memory device for CIM comprises a plurality of memory banks and a global multiply accumulate (MAC) circuit. Each of the memory banks comprises a first memory array, a first latch circuit, a second latch circuit and a local MAC circuit. The first latch circuit latches a first data from the first memory array in a first read cycle. The second latch circuit latches a second data from the first memory array in a second read cycle. The local MAC circuit performs a first stage CIM operation on a first latched data latched in the first latch circuit and the second latched data latched in the second latch circuit to provide a first stage CIM result. The global MAC circuit performs a second stage CIM operation on a plurality of first stage CIM results from the memory banks.

20 Claims, 6 Drawing Sheets

MEMORY DEVICE AND OPERATING METHOD FOR COMPUTING-IN-MEMORY

BACKGROUND

Recent developments in the field of artificial intelligence have resulted in various products and/or applications, including, but not limited to, speech recognition, image processing, machine learning, natural language processing, or the like. Such products and/or applications often use neural networks to process large amounts of data for learning, training, cognitive computing, or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
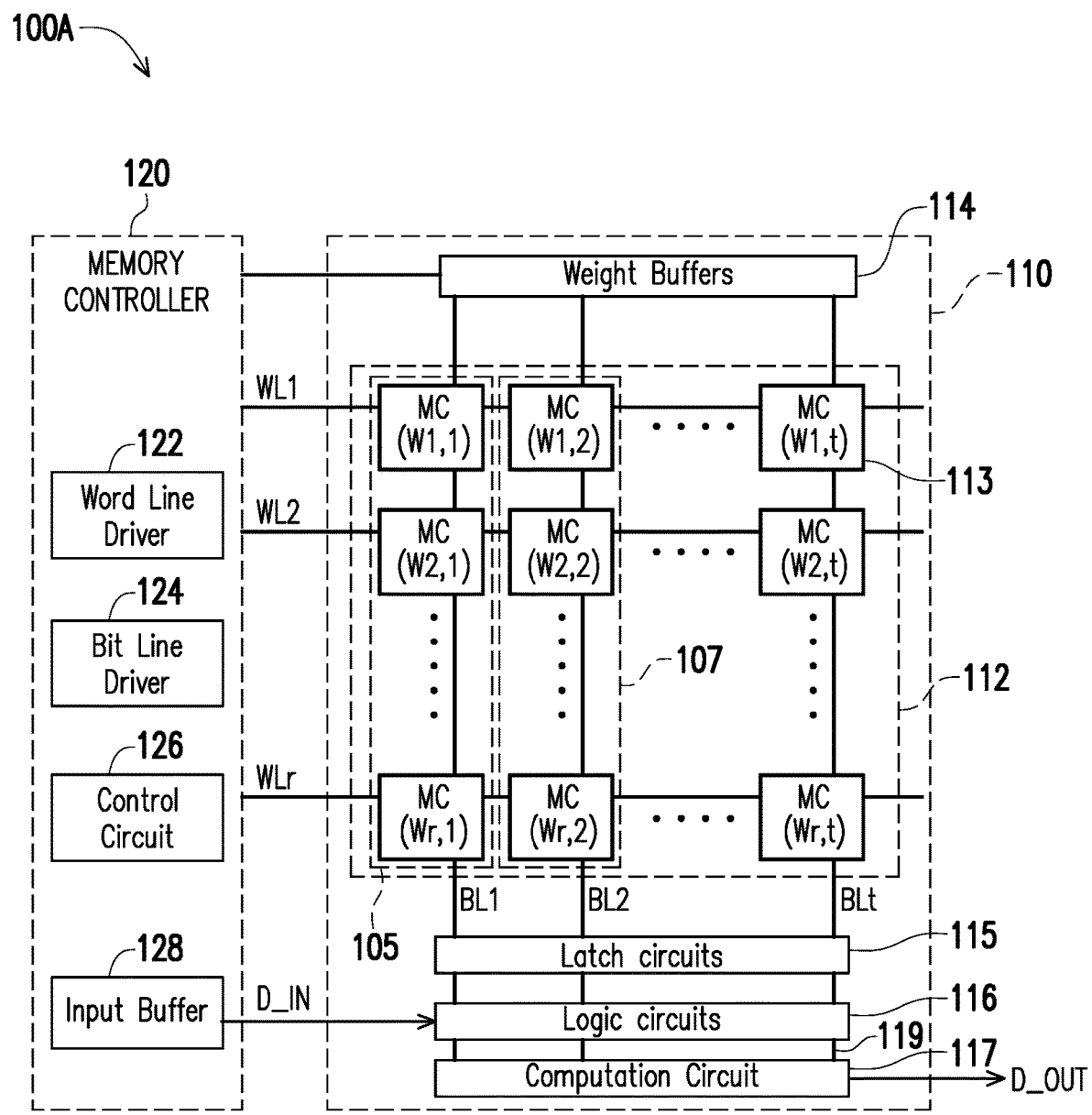
FIG. 1 is a schematic diagram of a memory device in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Memory devices configured to perform computing-in-memory (CIM) operations (also referred to herein as CIM memory devices) are usable neural network applications, as well as other applications. A CIM memory device includes a memory array configured to store weight data to be used, together with input data, in one or more CIM operations. After one or more CIM operations, the weight data in the memory array are updated for further CIM operations.

In some embodiments, one or more weight buffers are included in the same memory macro that contains the memory array storing the weight data. The one or more weight buffers are coupled to corresponding one or more memory segments (or memory subarrays) in the memory array. In at least one embodiment, weight data in one or more memory segments are updated from the corresponding one or more weight buffers, while other memory segments are being accessed to obtain weight data for a CIM operation. In at least one embodiment, weight data in one or more memory cells of a memory segment are updated from the corresponding weight buffer, while weight data in other memory cells of the same memory segment are used for a CIM operation. As a result, in one or more embodiments, it is possible to perform weight data updating and CIM operations at the same time. This is different from other approaches in which the whole memory array is accessed for a CIM operation and, therefore, CIM operations are stopped whenever weight data updating is performed. Because weight data updating and CIM operations are not performed at the same time in accordance with other approaches, such approaches potentially suffer from one or more issues, including, but not limited to, lowered performance, increased processing time, increased power consumption, or the like. Such issues are avoidable by CIM memory devices in accordance with some embodiments where it is possible to perform weight data updating and CIM operations at the same time. In at least one embodiment, because one or more weight buffers are included in the same memory macro as the memory array storing weight data, it is possible to eliminate, or at least reduce the size of, a weight buffer external to the memory macro. This is another difference from other approaches where external weight buffers are needed. Compared to other approaches, in at least one embodiment, CIM memory devices with no external weight buffers, or with size-reduced external weight buffers, provide one or more advantages including, but not limited to, reduced chip area, lowered manufacturing cost, improved performance, or the like.

FIG. 1 is a schematic diagram of a memory device in accordance with some embodiments. A memory device is a type of an integrated circuit (IC) device. In at least one embodiment, a memory device is an individual IC device. In some embodiments, a memory device is included as a part of a larger IC device which comprises circuitry other than the memory device for other functionalities.

In the embodiment, the memory device 100 comprises a memory macro 110 and a memory controller 120. The memory macro 110 comprises a memory array 112, one or more weight buffers 114, one or more latch circuits 115, one or more logic circuits 116, and computation circuit 117. The memory controller 120 comprises a word line driver 122, a bit line driver 124, a control circuit 126, and an input buffer 128. In some embodiments, one or more elements of the memory controller 120 are included in the memory macro 110, and/or one or more elements (except the memory array 112) of the memory macro 110 are included in the memory controller 120.

A macro has a reusable configuration and is usable in various types or designs of IC devices. In some embodiments, the macro is understood in the context of an analogy to the architectural hierarchy of modular programming in which subroutines/procedures are called by a main program (or by other subroutines) to carry out a given computational function. In this context, an IC device uses the macro to perform one or more given functions. Accordingly, in this context and in terms of architectural hierarchy, the IC device is analogous to the main program and the macro is analogous to subroutines/procedures. In some embodiments, the macro is a soft macro. In some embodiments, the macro is a hard macro. In some embodiments, the macro is a soft macro which is described digitally in register-transfer level (RTL) code. In some embodiments, synthesis, placement and routing have yet to have been performed on the macro such that the soft macro can be synthesized, placed and routed for a variety of process nodes. In some embodiments, the macro is a hard macro which is described digitally in a binary file format (e.g., Graphic Database System II (GDSII) stream format), where the binary file format represents planar geometric shapes, text labels, other information and the like of one or more layout-diagrams of the macro in hierarchical form. In some embodiments, synthesis, placement and routing have been performed on the macro such that the hard macro is specific to a particular process node.

A memory macro is a macro comprising memory cells which are addressable to permit data to be written to or read from the memory cells. In some embodiments, a memory macro further comprises circuitry configured to provide access to the memory cells and/or to perform a further function associated with the memory cells. For example, the memory macro 110 comprises memory cells MC as described herein, and the weight buffers 114, latch circuits 115, logic circuits 116 and computation circuit 117 form circuitry configured to provide a CIM function associated with the memory cells MC. In at least one embodiment, a memory macro configured to provide a CIM function is referred to as a CIM macro. The described macro configuration is an example. Other configurations are within the scopes of various embodiments.

The memory cells MC of the memory macro 110 are arranged in a plurality of columns and rows of the memory array 112. The memory controller 120 is electrically coupled to the memory cells MC and configured to control operations of the memory cells MC including, but not limited to, a read operation, a write operation, or the like.

In the embodiment, the memory array 112 further comprises a plurality of word lines (also referred to as "address lines") WL1 to WLr extending along the rows, and a plurality of bit lines (also referred to as "data lines") BL1 to BLt extending along the columns of the memory cells MC, where r and t are natural numbers. Each of the memory cells MC is electrically coupled to the memory controller 120 by at least one of the word lines, and at least one of the bit lines. In some example operations, word lines are configured for transmitting addresses of the memory cells MC to be read from, or for transmitting addresses of the memory cells MC to be written to, or the like. In at least one embodiment, a set of word lines is configured to perform as both read word lines and write word lines. Examples of bit lines include read bit lines for transmitting data read from the memory cells MC indicated by corresponding word lines, write bit lines for transmitting data to be written to the memory cells MC indicated by corresponding word lines, or the like. In at least one embodiment, a set of bit lines is configured to perform as both read bit lines and write bit lines.

The word lines are commonly referred to herein as WL, and the bit lines are commonly referred to herein as BL. Various numbers of word lines and/or bit lines in the memory array 112 are within the scope of various embodiments. Example memory types of the memory cells MC include, but are not limited to, static random-access memory (SRAM), resistive RAM (RRAM), magnetoresistive RAM (MRAM), phase change RAM (PCRAM), spin transfer torque RAM (STTRAM), floating-gate metal-oxide-semiconductor field-effect transistors (FGMOS), spintronics, or the like. In one or more example embodiments described herein, the memory cells MC include SRAM memory cells.

In the example configuration in FIG. 1, the memory cells MC are single-port memory cells. In some embodiments, a port of a memory cell is represented by a set of a word line WL and a bit line BL (referred to herein as a WL/BL set) which are configured to provide access to the memory cell in a read operation (i.e., read access) and/or in a write operation (i.e., write access). A single-port memory cell has one WL/BL set which is configured for both read access and write access, but not at the same time. A multi-port memory cell has several WL/BL sets each of which is configured for read access only, or for write access only, or for both read access and write access.

The memory array 112 comprises a plurality of memory segments. In some embodiments, a memory segment comprises a memory row, a memory column, a memory segment, or the like. A memory row comprises a plurality of memory cells coupled to the same word line WL. A memory column (also referred to as "memory string") comprises a plurality of memory cells coupled to the same bit line BL. A memory segment comprises more than one memory rows and/or more than one memory columns.

Each of the memory cells MC is configured to store a piece of weight data to be used in a CIM operation. In one or more example embodiments described herein, the memory cells MC are single-bit memory cells, i.e., each memory cell is configured to store a bit of weight data. This is an example, and multi-bit memory cells, each of which is configured to store more than one bit of weight data, are within the scopes of various embodiments. In some embodiments, a single-bit memory cell is also referred to as a bitcell. For example, the memory cell 113 coupled to the word line WL1 and the bit line BLt is configured to store a piece W1,t of the weight data. A combination of multiple pieces of weight data stored in multiple memory cells constitutes a weight value to be used in a CIM operation. For simplicity, a piece of weight data stored in a memory cell MC, multiple pieces of weight data stored in multiple memory cells MC, or all pieces of weight data stored in all memory cells MC of the memory array 112 are referred to herein as weight data.

In the embodiment, the weight buffers 114 are coupled to the memory array 112, and configured to temporarily hold new weight data to be updated in the memory array 112. In some embodiments as described herein, each memory segment is coupled to a corresponding weight buffer. In one or more embodiments as described herein, a common weight buffer is coupled to several memory segments. The weight buffers 114 are coupled to the memory cells MC in the memory array 112 via the bit lines BL. In a weight data updating operation, the new weight data are written into one or more memory cells MC from the weight buffers 114 and via the corresponding bit lines BL. As schematically illustrated in FIG. 1, the weight buffers 114 are coupled to the memory controller 120 to receive the new weight data and/or control signals that specify when and/or in which memory cells MC the new weight data are to be updated. In at least one embodiment, the new weight data are received from external circuitry outside the memory device 100, for example, a processor as described herein. The new weight data are received through one or more input/output (I/O) circuits (not shown) of the memory controller 120, and are forwarded to the weight buffers 114. Example weight buffers include, but are not limited to, registers, memory cells, or other circuit elements configured for data storage.

In the embodiment, the latch circuits 115 have inputs coupled to the bit lines BL to receive the weight data read out from one or more of the memory cells MC. The latch circuits 115 are configured to latch the weight data received from the bit lines BL, and supply the latched weight data to the logic circuits 116 via outputs of the latch circuits 115. As a result, while the latched weight data are being used in a CIM operation at the logic circuits 116 and/or the computation circuit 117 as described herein, the bit lines BL are usable in a write operation to update one or more memory cells MC with new weight data from the weight buffers 114. The simultaneous performance of weight data updating and CIM operations provides one or more advantages, as described herein. Examples of the latch circuits 115 include flip-flops, latches, or the like. In some embodiments, each latch unit among the latch circuits 115 is coupled to a bit line among the bit lines BL of the memory array 112.

Besides the described simultaneous performance of weight data updating and CIM operations for different memory cells in a memory segment, it is also possible to simultaneously perform weight data updating and CIM operations in different memory segments in accordance with some embodiments. For example, the weight data in a memory column 105 are updated by new weight data supplied from a corresponding weight buffer among the weight buffers 114 over the bit line BL1, while, at the same time, the weight data read out from a memory column 107 over a different bit line BL2 are being used in a CIM operation. The presence of different data on different bit line BLs does not affect or disturb the simultaneously performed weight data updating and CIM operations, in at least one embodiment.

In the embodiment, the logic circuits 116 have inputs coupled to the outputs of the latch circuits 115. The logic circuits 116 have further inputs coupled to receive input data D_IN to be used with the weight data in a CIM operation. In the example configuration in FIG. 1, the input data D_IN are supplied from the input buffer 128 in the memory controller 120. In one or more embodiments, the input data D_IN are output data supplied from another memory macro (not shown) of the memory device 100. In some embodiments, the input data D_IN are serially supplied to the logic circuits 116 in the form of a stream of bits, as described herein. The logic circuits 116 are configured to generate, at outputs thereof, intermediate data 119 corresponding to the input data D_IN and the weight data read from one or more of the memory cells MC. Examples of the logic circuits 116 include, but are not limited to, NOR gates, AND gates, any other logic gates, combinations of logic gates, or the like.

In the embodiment, the computation circuit 117 is coupled to the outputs of the logic circuits 116, and is configured to, based on the intermediate data 119 output from the logic circuits 116, generate output data D_OUT corresponding to a CIM operation performed on the input data D_IN and the weight data read from one or more of the memory cells MC. Examples of CIM operations include, but are not limited to, mathematical operations, logical operations, combination thereof, or the like. In some embodiments, the computation circuit 117 is configured to combine multiple intermediate data 119 output by multiple logic circuits 116 into the output data D_OUT. In at least one embodiment, the computation circuit 117 comprises a Multiply Accumulate (MAC) circuit, and the CIM operation comprises a multiplication of one or more multibit weight values with one or more multibit input data values. Further computation circuits configured to perform CIM operations other than a multiplication are within the scopes of various embodiments. In some embodiments, the output data D_OUT are supplied, as input data, to another memory macro (not shown) of the memory device 100. In one or more embodiments, the output data D_OUT are output, through one or more I/O circuits (not shown) of the memory controller 120, to external circuitry outside the memory device 100, for example, a processor as described herein.

In the example configuration in FIG. 1, the controller 120 comprises the word line driver 122, the bit line driver 124, the control circuit 126, and the input buffer 128. In at least one embodiment, the controller 120 further includes one or more clock generators for providing clock signals for various components of the memory device 100, one or more input/output (I/O) circuits for data exchange with external devices, and/or one or more controllers for controlling various operations in the memory device 100.

In the embodiment, the word line driver 122 is coupled to the memory array 112 via the word lines WL. The word line driver 122 is configured to decode a row address of the memory cell MC selected to be accessed in a read operation or a write operation. The word line driver 122 is configured to supply a voltage to the selected word line WL corresponding to the decoded row address, and a different voltage to the other, unselected word lines WL.

In the embodiment, the bit line driver 124 is coupled to the memory array 112 via the bit lines BL. The bit line driver 124 is configured to decode a column address of the memory cell MC selected to be accessed in a read operation or a write operation. The bit line driver 124 is configured to supply a voltage to the selected bit line BL corresponding to the decoded column address, and a different voltage to the other, unselected bit lines BL.

In the embodiment, the control circuit 126 is coupled to one or more of the weight buffers 114, latch circuits 115, logic circuits 116, computation circuit 117, word line driver 122, bit line driver 124, input buffer 128 to coordinate operations of these circuits, drivers and/or buffers in the overall operation of the memory device 100. For example, the support 126 is configured to generate various control signals for controlling operations of one or more of the weight buffers 114, latch circuits 115, logic circuits 116, computation circuit 117, word line driver 122, bit line driver 124, input buffer 128.

In the embodiment, the input buffer 128 is configured to receive the input data from external circuitry outside the memory device 100, for example, a processor as described herein. The input data are received through one or more I/O circuits (not shown) of the memory controller 120, and are forwarded via the input buffer 128 to the logic circuits 116. Example input buffers include, but are not limited to, registers, memory cells, or other circuit elements configured for data storage.

In at least one embodiment, CIM memory devices, such as the memory device 100, are advantageous over other approaches, where data are moved back and forth between the memory and a processor, because such back-and-forth data movement, which is a bottleneck to both performance and energy efficiency, is avoidable. Examples CIM applications include, but are not limited to, artificial intelligence, image recognition, neural network for machine learning, or the like. In some embodiments, the memory device 100 makes it possible to simultaneously perform weight data updating and CIM operations, in one or more embodiments.

Figure 2A:
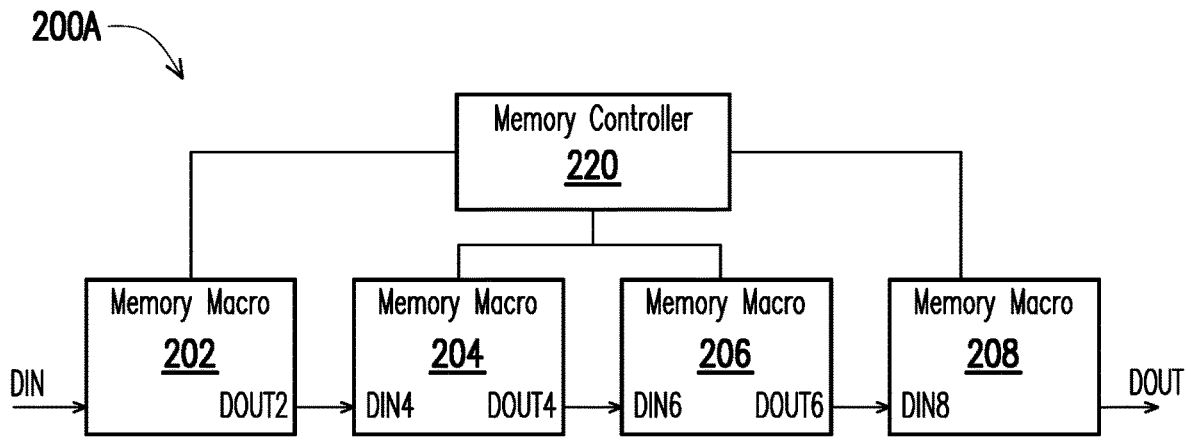
FIG. 2A is a schematic diagram of a memory device in accordance with some embodiments.

FIG. 2A is a schematic diagram of a memory device 200A in accordance with some embodiments. The memory device 200A comprises memory macros 202, 204, 206, 208 and memory controller 220. In some embodiments, one or more of the memory macros 202, 204, 206, 208 correspond to one or more of the memory macros 110, and/or the memory controller 220 corresponds to the memory controller 120. In the example configuration in FIG. 2A, the memory controller 220 is a common memory controller for the memory macros 202, 204, 206, 208. In at least one embodiment, at least one of the memory macros 202, 204, 206, 208 has its own memory controller. The number of four memory macros in the memory device 200A is an example. Other configurations are within the scopes of various embodiments.

The memory macros 202, 204, 206, 208 are coupled to each other in sequence, with output data of a preceding memory macro being input data for a subsequent memory macro. For example, input data DIN is input into the memory macro 202. The memory macro 202 performs one or more CIM operations based on the input data DIN and weight data stored in the memory macro 202, and generates output data DOUT2 as results of the CIM operations. The output data DOUT2 are supplied as input data DIN4 of the memory macro 204. The memory macro 204 performs one or more CIM operations based on the input data DIN4 and weight data stored in the memory macro 204, and generates output data DOUT4 as results of the CIM operations. The output data DOUT4 are supplied as input data DIN6 of the memory macro 206. The memory macro 206 performs one or more CIM operations based on the input data DIN6 and weight data stored in the memory macro 206, and generates output data DOUT6 as results of the CIM operations. The output data DOUT6 are supplied as input data DIN8 of the memory macro 208. The memory macro 208 performs one or more CIM operations based on the input data DIN8 and weight data stored in the memory macro 208, and generates output data DOUT as results of the CIM operations. One or more of the input data DIN, DIN4, DIN6, DIN8 correspond to the input data D_IN described with respect to FIG. 1, and/or one or more of the output data DOUT2, DOUT4, DOUT6, DOUT correspond to the output data D_OUT described with respect to FIG. 1. In at least one embodiment, the described configuration of the memory macros 202, 204, 206, 208 implements a neural network. In at least one embodiment, one or more advantages described herein are achievable by the memory device 200A.

Figure 2B:
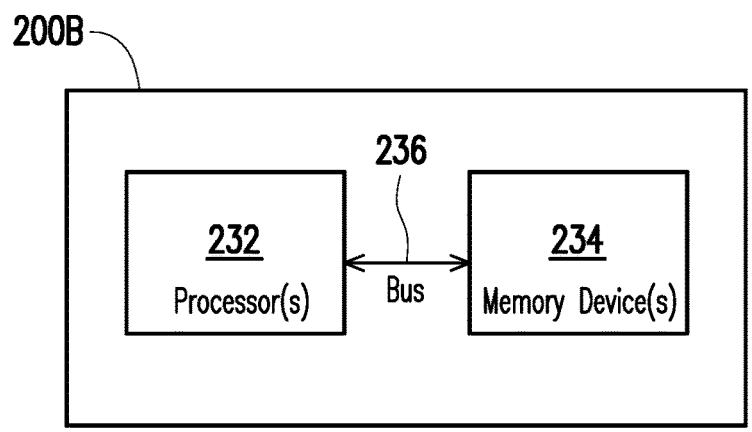
FIG. 2B is a schematic diagram of an integrated circuit (IC) device in accordance with some embodiments.

FIG. 2B is a schematic diagram of an integrated circuit (IC) device 200B in accordance with some embodiments. The IC device 200B comprises one or more hardware processors 232, one or more memory devices 234 coupled to the processors 232 by one or more buses 236. In some embodiments, the IC device 200B comprises one or more further circuits including, but not limited to, cellular transceiver, global positioning system (GPS) receiver, network interface circuitry for one or more of Wi-Fi, USB, Bluetooth, or the like. Examples of the processors 232 include, but are not limited to, a central processing unit (CPU), a multi-core CPU, a neural processing unit (NPU), a graphics processing unit (GPU), a digital signal processor (DSP), a field-programmable gate array (FPGA), an application-specific integrated circuit (ASIC), other programmable logic devices, a multimedia processor, an image signal processors (ISP), or the like. Examples of the memory devices 234 include one or more memory devices and/or memory macros described herein. In at least one embodiment, each of the processors 232 is coupled to a corresponding memory device among the memory devices 234.

Because the one or more of the memory devices 234 are CIM memory devices, various computations are performed in the memory devices which reduces the computing workload of the corresponding processor, reduces memory access time, and improves performance. In at least one embodiment, the IC device 200C is a system-on-a-chip (SOC). In at least one embodiment, one or more advantages described herein are achievable by the IC device 200C.

Figure 3:
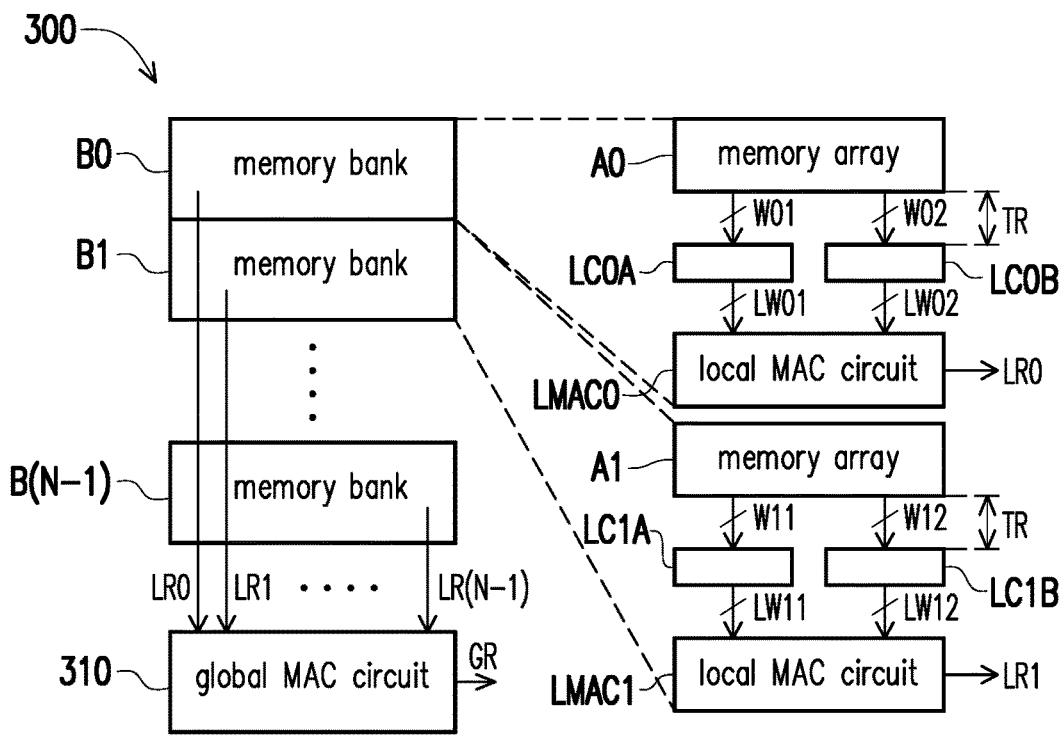
FIG. 3 is a schematic diagram of a memory device in accordance with some embodiments.

FIG. 3 is a schematic diagram of a memory device in accordance with some embodiments. As illustrated in FIG. 3, the memory device 300 comprises N memory banks B0, B1, . . . , and B(N−1) and a global MAC circuit 310, where N is a natural number. Each of the memory banks B0, B1, . . . , B(N−1) corresponds to at least one portion of the memory macro 110 in FIG. 1 or at least one portion of the memory macro 202 in FIG. 2A. In the embodiment, the memory banks B0 comprises a memory array A0, latch circuits LC0A and LC0B, and a local MAC circuit LMAC0. The latch circuit LC0A is coupled to the memory array A0. The latch circuit LC0A latches a first data W01 from the memory array A0 in a first read cycle. The latch circuit LC0B is coupled to the memory array A0. The latch circuit LC0B latches a second data W02 from the memory array A0 in a second read cycle. The first data W01 is a one-bit or multi-bit weight data. The second data W02 is a one-bit or multi-bit weight data.

In at least one embodiment, the memory array A0 comprises bit lines corresponding to the bit lines BL1 to BLt in FIG. 1. The latch circuit LC0A is coupled to the bit lines. The first data W01 is stored in the first row of memory cells of the memory array A0. In the first read cycle, the first data W01 from the first row of memory cells is readout to the latch circuit LC0A through the bit lines. Therefore, the latch circuit LC0A may latch the first data W01 on the bit lines. The latch circuit LC0B is coupled to the bit lines. The second data W02 is stored in the second row of memory cells of the memory array A0. In the second read cycle, the second data W02 from the second row of memory cells is readout to the latch circuit LC0B through the bit lines. Therefore, the latch circuit LC0B may latch the second data W02 on the bit lines. In the embodiment, the first read cycle and the second read cycle are adjacent cycles of a memory clock.

The local MAC circuit LMAC0 corresponds to computation circuit 117 in FIG. 1. The local MAC circuit LMAC0 is coupled to the first latch circuits LC0A and LC0B. The local MAC circuit LMAC0 performs a first stage CIM operation (or local CIM operation) on at least one of a first latched data LW01 latched in the latch circuit LC0A and a second latched data LW02 latched in the latch circuit LC0B to provide a first stage CIM result LR0.

The memory banks B1 comprises a memory array A1, latch circuits LC1A and LC1B, and a local MAC circuit LMAC1. The latch circuit LC1A is coupled to the memory array A1. The latch circuit LC0A latches the first data W11 from the memory array A1 in the first read cycle. The latch circuit LC1B is coupled to the memory array A1. The latch circuit LC1B latches the second data W12 from the memory array A1 in the second read cycle.

In at least one embodiment, the memory array A1 comprises bit lines corresponding to the bit lines BL1 to BLt in FIG. 1. The latch circuit LC1A is coupled to the bit lines. The first data W11 is stored in the first row of memory cells of the memory array A1. In the first read cycle, the first data W11 from the first row of memory cells is readout to the latch circuit LC1A through the bit lines. The latch circuit LC1B is coupled to the bit lines. The second data W12 is stored in the second row of memory cells of the memory array A1. In the second read cycle, the second data W12 from the second row of memory cells is readout to the latch circuit LC through the bit lines. The local MAC circuit LMAC1 is coupled to the latch circuits LC1A and LC1B. The local MAC circuit LMAC1 performs a first stage CIM operation on at least one of the first latched data LW11 latched in the latch circuit LC1A and the second latched data LW12 latched in the latch circuit LC1B to provide a first stage CIM result LR1.

In some embodiments, a number of memory cells in the memory array A1 is equal to a number of memory cells in the memory array A0. In some embodiments, the number of memory cells in the memory array A1 is not equal to the number of memory cells in the memory array A0.

Similar to the first stage CIM operations in the memory banks B0 and B1, the memory banks B(N−1) also performs a first stage CIM operation and provide a first stage CIM result LR(N−1). The second stage CIM result GR corresponds to one of the output data DOUT2, DOUT4, DOUT6, and DOUT as shown in FIG. 2.

In at least one embodiment, each of the first stage CIM results LR0, LR1, . . . , and LR(N−1) corresponds to the output data D_OUT as shown in FIG. 2A.

The global MAC circuit 310 is coupled to the memory banks B0, B1, . . . , and B(N−1). The global MAC circuit 310 performs a second stage CIM operation (or global CIM operation) on the first stage CIM results LR0, LR1, . . . , and LR(N−1) supplied from the memory banks B0, B1, . . . , and B(N−1) and provide a second stage CIM result GR.

In at least one embodiment, the second stage CIM result GR corresponds to one of the output data DOUT2, DOUT4, DOUT6, and DOUT as shown in FIG. 2A.

Generally, a memory bank has the same number of memory arrays and latch circuits. Transition regions between the memory arrays and the corresponding latch circuits would be an area overhead. Transition regions are routing regions. In the case that the storage array has fewer memory cells, the memory bank needs to have a larger number of storage arrays and latch circuits arranged in different positions in the memory bank. Therefore, the transition regions provide a large area overhead. In the case that the storage array has large memory cells, the memory bank needs to have a smaller number of storage arrays and latch circuits. Therefore, the transition regions provide a small area overhead. However, a computing parallelism (or computing speed) of the memory bank would be decreased because of a smaller number of the latch circuit.

In the memory bank B0 of the embodiment, based on the configuration of the latch circuits LC0A and LC0B, it is allowable to enlarge memory array A0 and latch the first data W01 and the second data W02. For example, a M-rows array could be enlarged to a 2×M-rows array, where M is a natural number. Therefore, the memory bank B0 has a smaller area (become a half) of transition region TR and keeps high computing parallelism (or computing speed). Weight information latched in latch circuits will be reused at many times. In the embodiment, the local MAC circuit LMAC0 may receive the first latched data LW01 and the second latched data LW02 at one time. Thus, if the number of latch circuits is increased, the computing parallelism of the memory device 300 would be increased.

For ease of description, this embodiment takes two latch circuits in memory bank B0 and B1 as an example. The number of two latch circuits of the invention may be a plurality, and is not limited to this embodiment.

In some embodiments, if the local MAC circuit LMAC0 needs to perform the first stage CIM operation on the same data, the latch circuits LC0A and LC0B may latch the same data in the same read cycle. For example, the latch circuits LC0A and LC0B may latch the first data W01 in the first read cycle.

Figure 4:
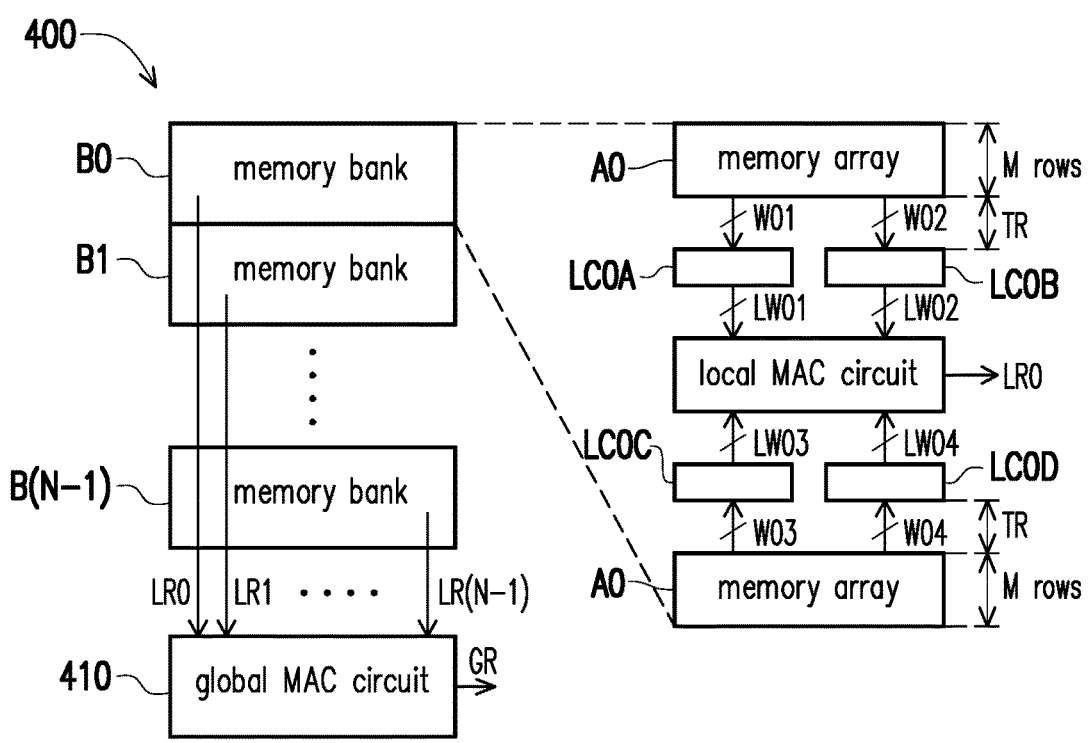
FIG. 4 is a schematic diagram of a memory device in accordance with some embodiments.

FIG. 4 is a schematic diagram of a memory device in accordance with some embodiments. As illustrated in FIG. 4, the memory device 400 comprises N memory banks B0, B1, . . . , B(N−1) and a global MAC circuit 410. In the embodiment, the memory banks B0 comprises a memory array A0 and A1, latch circuits LC0A, LC0B, LC0C and LC0D and the local MAC circuit LMAC0. The latch circuit LC0A is coupled to the memory array A0. The latch circuit LC0A latches the first data W01 from the memory array A0 in the first read cycle. The latch circuit LC0B is coupled to the memory array A0. The latch circuit LC0B latches the second data W02 from the memory array A0 in the second read cycle.

The latch circuit LC0C is coupled to the memory array A1. The latch circuit LC0C latches a third data W03 from the memory array A1 in the first read cycle. The latch circuit LC0D is coupled to the memory array A1. The latch circuit LC0D latches a fourth data from the memory array A1 in the second read cycle.

In the embodiment, the memory array A1 comprises bit lines. The latch circuit LC0C is coupled to the bit lines of the memory array A1. The third data W03 is stored in the first row of memory cells of the memory array A1. In the first read cycle, the third data W03 from the first row of memory cells is readout to the latch circuit LC0C through the bit lines of the memory array A1. The latch circuit LC0D is coupled to the bit lines. The fourth data W04 is stored in the second row of memory cells of the memory array A1. In the second read cycle, the fourth data W04 from the second row of memory cells is readout to the latch circuit LC0D through the bit lines of the memory array A1. The local MAC circuit LMAC0 is coupled to the latch circuits LC0A, LC0B, LC0C and LC0D. The local MAC circuit LMAC0 performs a first stage CIM operation on at least one of the first latched data LW01 latched in the latch circuit LC0A, the second latched data LW02 latched in the latch circuit LC0B, the third latched data LW03 latched in the latch circuit LC0C, and a fourth latched data LW04 latched in the latch circuit LC0D to provide a first stage CIM result LR0.

In some embodiments, a number of memory cells in the memory array A1 is equal to a number of memory cells in the memory array A0. The memory array A0 and A1 are M-rows arrays respectively. In some embodiments, the number of memory cells in memory array A1 is not equal to the number of memory cells in memory array A0.

Figure 5:
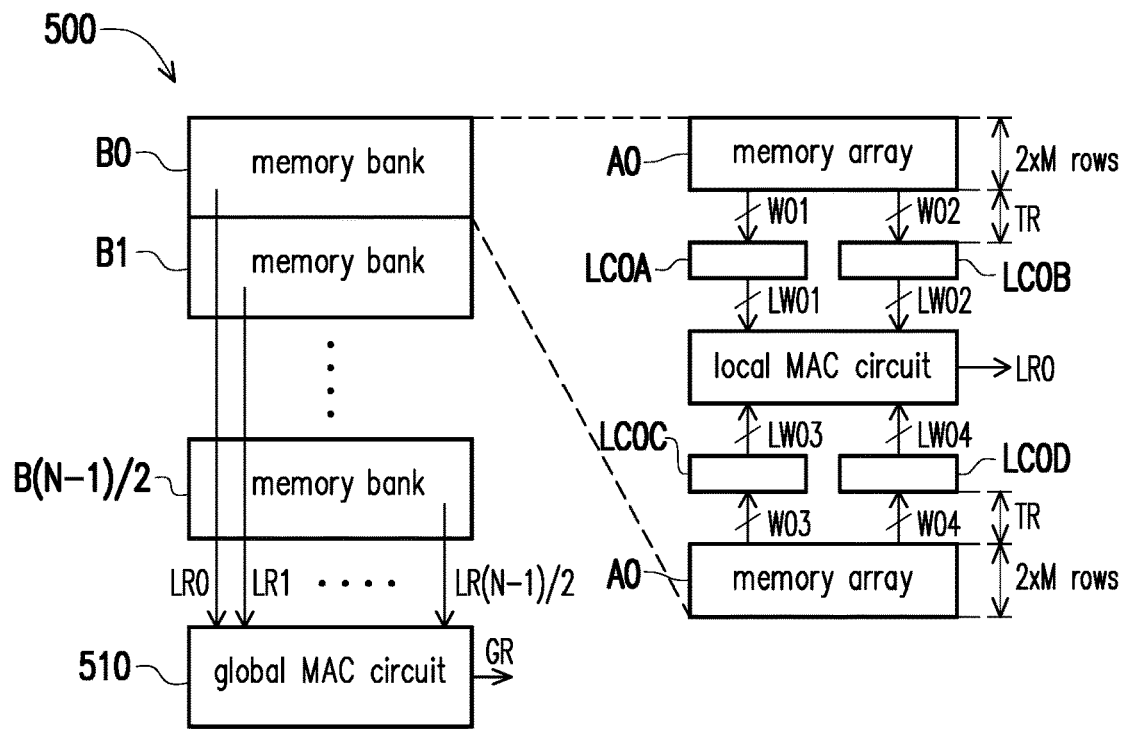
FIG. 5 is a schematic diagram of a memory device in accordance with some embodiments.

FIG. 5 is a schematic diagram of a memory device in accordance with some embodiments. As illustrated in FIG. 5, the memory device 500 comprises memory banks B0, B1, . . . , B(N−1)/2 and a global MAC circuit 510. In the embodiment, the memory banks B0 comprises a memory array A0 and A1, latch circuits LC0A, LC0B, LC0C and LC0D and the local MAC circuit LMAC0. The latch circuit LC0A is coupled to the memory array A0. The latch circuit LC0A latches the first data W01 from the memory array A0 in the first read cycle. The latch circuit LC0B is coupled to the memory array A0. The latch circuit LC0B latches the second data W02 from the memory array A0 in the second read cycle. The latch circuit LC0C is coupled to the memory array A1. The latch circuit LC0C latches the third data W03 from the memory array A1 in the first read cycle. The latch circuit LC0D is coupled to the memory array A1. The latch circuit LC0D latches the fourth data W04 from the memory array A1 in the second read cycle.

It should be noted that the memory array A0 and A1 are enlarged to be 2×M-rows arrays respectively. Therefore, a number of the memory banks on the memory device 500 is half of a number of the memory banks on the memory device 400. A length of the bit lines and number of the word lines in the memory bank B0 become double. The memory bank B0 has smaller area (become a half) of transition regions and keeps high parallelism.

Figure 6:
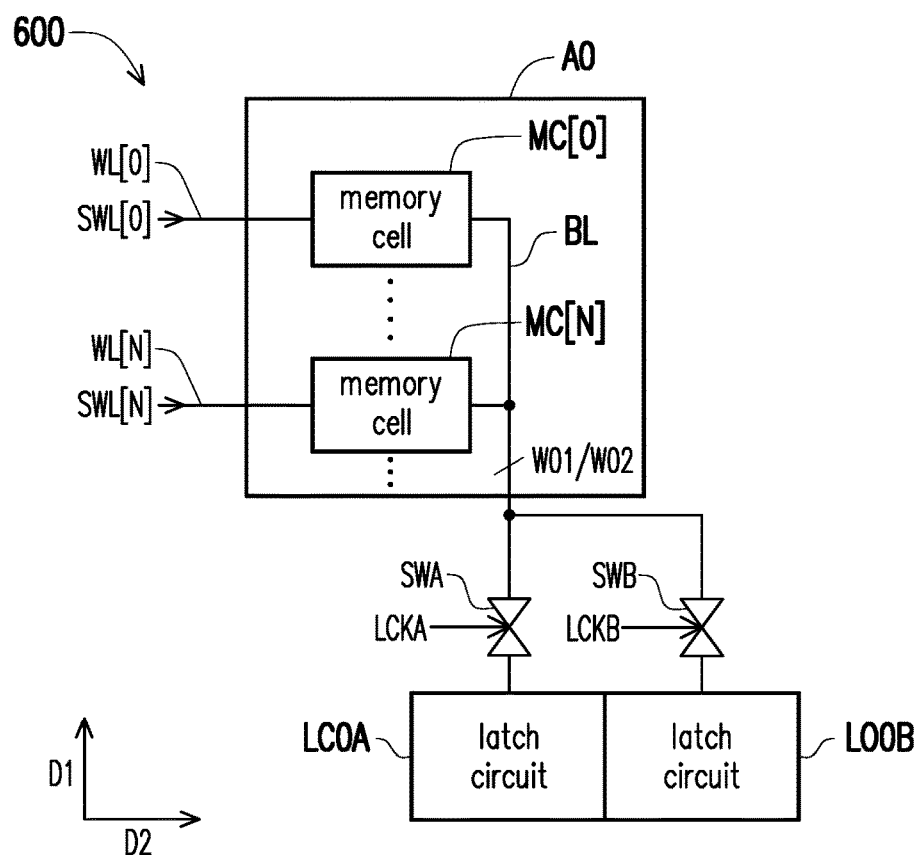
FIG. 6 is a schematic diagram of a memory bank in accordance with some embodiments.

FIG. 6 is a schematic diagram of a memory bank in accordance with some embodiments. In the embodiment, the memory bank 600 corresponds to at least one portion of the memory macro 110 in FIG. 1, at least one portion of the memory macro 202 in FIG. 2A or one of the memory banks B0, B1, . . . , and B(N-1) in FIG. 3. The memory bank 600 comprises a memory array A0, latch circuits LC0A and LC0B and switches SWA and SWB. The memory array A0 comprises memory cells and one bit line BL, but not limited in the disclosure. The memory array A0 is a one-column memory array, but not limited in the disclosure. The bit line BL may be a read bit line, but not limited in the disclosure. In the embodiment, the first data W01 is a one-bit weight data. The second data W02 is a one-bit weight data.

In some embodiments, the memory array A0 is a multi-column memory array and a plurality of bit lines. Therefore, the first data W01 is a multi-bit weight data. The second data W02 is a multi-bit weight data.

In the embodiment, the switch SWA is coupled between the first latch circuit LC0A and the bit line BL. The switch SWA transmits the first data W01 on the bit line BL to the latch circuit LC0A in response to a latch signal LCKA. The latch circuit LC0A is coupled to the memory array A0. The latch circuit LC0A latches the first data W01 from the memory array A0 in the first read cycle. The switch SWB is coupled between the latch circuit LC0B and the bit line BL. The switch SWB transmits the second data W02 on the bit line BL to the latch circuit LC0B in response to a latch signal LCKB. The latch circuit LC0B is coupled to the memory array A0. The latch circuit LC0B latches the second data W02 from the memory array A0 in the second read cycle.

Figure 7:
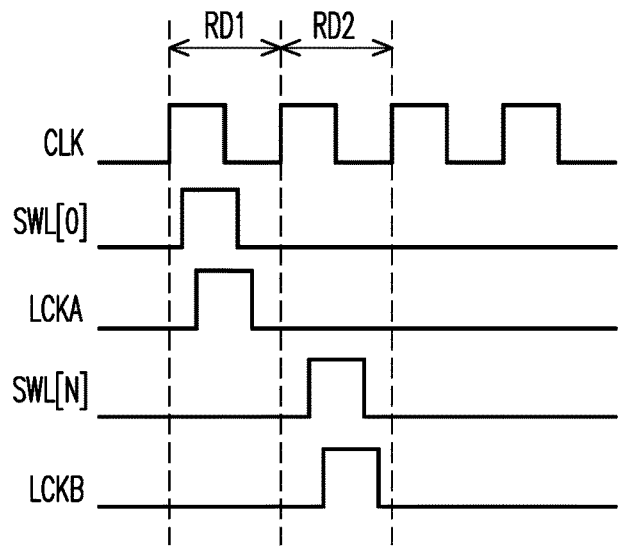
FIG. 7 is a timing diagram for CIM operation in the memory bank of FIG. 6 in accordance with some embodiments.

Please refer to FIGS. 6 and 7, FIG. 7 is a timing diagram for CIM operation in the memory bank of FIG. 6 in accordance with some embodiments. The first read cycle RD1 and the second read cycle RD2 are defined by a memory clock CLK. For example, the first read cycle RD1 is one cycle of the memory clock CLK and the second read cycle RD2 is another cycle of the memory clock CLK.

In the first read cycle RD1, a memory cell MC0 in the memory array A0 is selected by a word line signal SWL[0] on a word line WL[0]. The first data W01 stored in the memory cell MC[0] is output to the bit line BL. In the first read cycle RD1, the switch SWA is turned on in response to a high logic of the latch signal LCKA. The switch SWB is turned off in response to a low logic of the latch signal LCKB. Therefore, the latch circuit LC0A receives the first data W01 from the memory cell MC[0] in the first read cycle RD1. The latch circuit LC0B does not receive the first data W01 from the memory cell MC[0] in the first read cycle RD1. The latch signals LCKA and LCKB may be provided by a memory controller (not shown). For example, memory controller may be the memory controller 120 of the memory device 100 as shown in FIG. 1 or the memory controller 220 of the memory device 200A as shown in FIG. 2A.

In the second read cycle RD2, a memory cell MC[N] in the memory array A0 is selected by a word line signal SWL[N] on a word line WL[N]. The second data W02 stored in the memory cell MC[N] is output to the bit line BL. In the second read cycle RD2, the switch SWA is turned off in response to a low logic of the latch signal LCKA. The switch SWB is turned on in response to a high logic of the latch signal LCKB. Therefore, the latch circuit LC0B receives the second data W02 from the memory cell MC[N] in the second read cycle RD2. The latch circuit LC0A does not receive the second data W02 from the memory cell MC[N] in second read cycle RD2.

Please refer to FIG. 6 again, in the embodiment, the switch SWA is implemented by a transmission gate. The switch SWB is implemented by another transmission gate. In the embodiment, the switch SWA is implemented by a transistor. The switch SWB is implemented by another transistor. In some embodiments, the switch SWA is implemented by a transmission gate. The switch SWB is implemented by a transistor. In some embodiments, the switch SWA is implemented by a transistor. The switch SWB is implemented by a transmission gate.

In the embodiment, the switches SWA and SWB are located in a transition region in memory bank 600. In some embodiments, the switch SWA is located in the latch circuit LC0A. The switch SWB is located in the latch circuit LC0B.

In the embodiment, the bit line BL is extended in a first direction D1. The latch circuits LC0A and LC0B are arranged in a second direction D2 different from the first direction D1. For example, in the embodiment, the first direction D1 and the second direction D2 are orthogonal each other.

Figure 8:
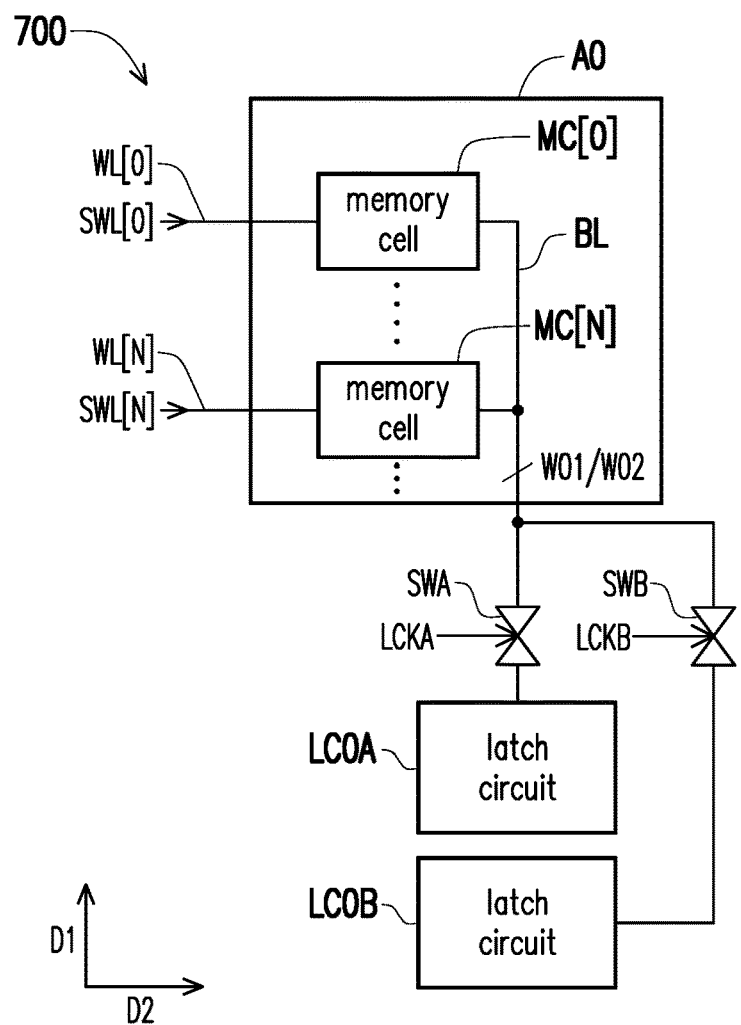
FIG. 8 is a schematic diagram of a memory bank in accordance with some embodiments.

FIG. 8 is a schematic diagram of a memory bank in accordance with some embodiments. In the embodiment, the memory bank 700 corresponds to at least one portion of the memory macro 110 in FIG. 1, at least one portion of the memory macro 202 in FIG. 2A or one of the memory banks B0, B1, . . . , and B(N-1) in FIG. 3. The memory bank 700 comprises a memory array A0, latch circuits LC0A and LC0B and switches SWA and SWB. The memory array A0 comprises memory cells and one bit line BL, but not limited in the disclosure. The memory array A0 is a one-column memory array, but not limited in the disclosure. The bit line BL may be a read bit line, but not limited in the disclosure. In the embodiment, the bit line BL is extended in the first direction D1. The latch circuits LC0A and LC0B are arranged in the second direction D1.

Figure 9:
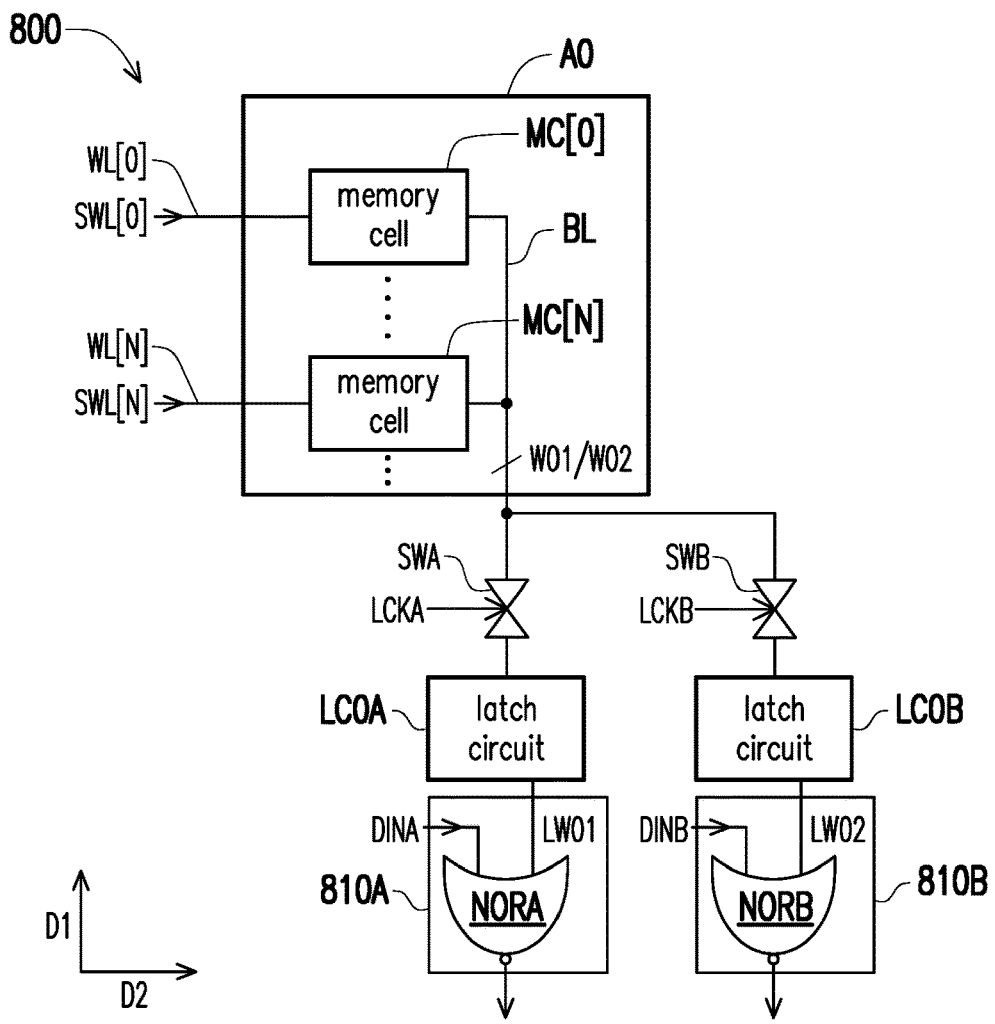
FIG. 9 is a schematic diagram of a memory bank in accordance with some embodiments.

FIG. 9 is a schematic diagram of a memory bank in accordance with some embodiments. In the embodiment, the memory bank 800 corresponds to at least one portion of the memory macro 110 in FIG. 1, at least one portion of the memory macro 202 in FIG. 2A or one of the memory banks B0, B1, . . . , and B(N-1) in FIG. 3. The memory bank 800 comprises a memory array A0, latch circuits LC0A and LC0B, switches SWA and SWB and logic circuits 810A and 810B. The memory array A0 is a one-column memory array, but not limited in the disclosure. The bit line BL may be a read bit line, but not limited in the disclosure. The operations of the latch circuits LC0A and LC0B and the switches SWA and SWB has disclosed in the embodiments of FIGS. 6, 7, and 8. In the embodiment, the logic circuit 810A is coupled to the latch circuit LC0A. The logic circuit 810A outputs the first latched data LW01 latched in the latch circuit LC0A in response to a first input data DINA. The logic circuit 810B is coupled to the latch circuit LC0B. The logic circuit 810B outputs the second latched data LW02 latched in the latch circuit LC0B in response to a second input data DINB.

In the embodiment, the logic circuits 810A comprises a NOR logic circuit NORA. The NOR logic circuit NORA has a first input port, a second input port and an output port. The first input port of the NOR logic circuit NORA is connected to the latch circuit LC0A. The first input port of the NOR logic circuit NORA is used to receive the first latched data LW01. The second input port of the NOR logic circuit NORA is used to receive the first input data DINA. The NOR logic circuit NORA performs a NOR logic operation on the first latched data LW01 and the first input data DINA to generate an output data. The NOR logic circuit NORA output the output data through the output port. For example, if the first input data DINA is high, the output data is low. If the first input data DINA is low, the output data is associated to the first latched data LW01 (for example, an inverted first latched data LW01).

In the embodiment, the logic circuits 810B comprises a NOR logic circuit NORB. Similar to the NOR logic circuit NORA, the NOR logic circuit NORB has a first input port, a second input port and an output port. The first input port of the NOR logic circuit NORB is connected to the latch circuit LC0B. The first input port is used to receive the second latched data LW02. The second input port of the NOR logic circuit NORB is used to receive the second input data DINB. The NOR logic circuit NORB performs a NOR logic operation on the second latched data LW02 and the second input data DINB to generate an output data. The NOR logic circuit NORB output the output data through the output port. For example, if the second input data DINB is high, the output data is low. If the second input data DINB is low, the output data is associated to the second latched data LW02 (for example, an inverted first latched data LW01).

Figure 10:
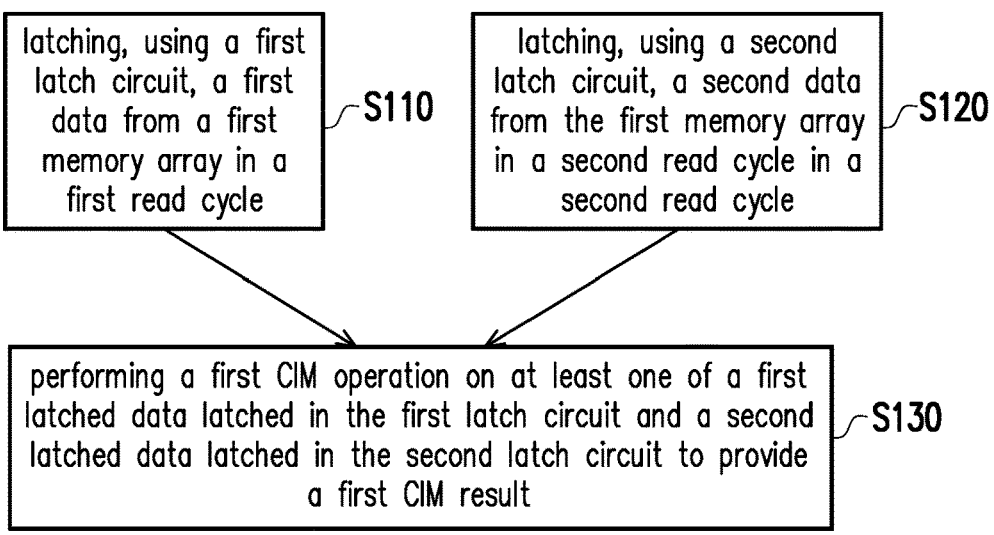
FIG. 10 is a flowchart of an operating method in accordance with some embodiments.

FIG. 10 is a flowchart of an operating method in accordance with some embodiments. In the embodiment, the operating method is performed in or by one or more ICs, memory devices, memory macros or memory banks described with respect to FIGS. 3-9. The operating method comprises operation steps S110, S120, S130.

At the operation step S110, a first data from a first memory array is latched in a first read cycle using a first latch circuit. For example, as described with respect to FIG. 3, the latch circuit LC0A latches a first data W01 from the memory array A0 in the first read cycle. For example, the first data W01 is stored in the first row of memory cells of the memory array A0. In the first read cycle, the first data W01 from the first row of memory cells is readout to the latch circuit LC0A through the bit lines. Therefore, the latch circuit LC0A may latch the first data W01 on the bit lines.

At the operation step S120, a second data from a first memory array is latched in a second read cycle using a second latch circuit. The second read cycle is different from the first read cycle. For example, as described with respect to FIG. 3, the latch circuit LC0B latches a second data W02 from the memory array A0 in the second read cycle. For example, the second data W02 is stored in the second row of memory cells of the memory array A0. In the second read cycle, the second data W02 from the second row of memory cells is readout to the latch circuit LC0B through the bit lines. Therefore, the latch circuit LC0B may latch the second data W02 on the bit lines.

In some embodiments, the operation step S120 lags behind the operation step S110 in timing. In some embodiments, the operation step S120 leads the operation step S110 in timing.

At the operation step S130, a first CIM operation is performed on at least one of a first latched data latched in the first latch circuit and a second latched data latched in the second latch circuit to provide a first CIM result. For example, as described with respect to FIG. 3, the operation step S130 is performed by the local MAC circuit LMAC0. The local MAC circuit LMAC0 performs a first stage CIM operation (or local CIM operation) on at least one of a first latched data LW01 latched in the latch circuit LC0A and a second latched data LW02 latched in the latch circuit LC0B to provide a first stage CIM result LR0.

In some embodiments, a memory device for CIM comprises a plurality of memory banks and a global MAC circuit. Each of the plurality of memory banks comprises a first memory array, a first latch circuit, a second latch circuit and a local MAC circuit. The first latch circuit is coupled to the first memory array. The first latch circuit latches a first data from the first memory array in a first read cycle. The second latch circuit is coupled to the first memory array. The second latch circuit latches a second data from the first memory array in a second read cycle. The MAC circuit is coupled to the first latch circuit and the second latch circuit. The local MAC circuit performs a first stage CIM operation on at least one of a first latched data latched in the first latch circuit and the second latched data latched in the second latch circuit to provide a first stage CIM result. The global MAC circuit is coupled to the plurality of memory banks. The global MAC circuit performs a second stage CIM operation on a plurality of first stage CIM results from the plurality of memory banks.

In some embodiments, a memory device for CIM comprises a plurality of memory banks and a global MAC circuit. Each of the plurality of memory banks comprises a first memory array, a plurality of latch circuits and a local MAC circuit. The first memory array, comprising least one bit line. The latch circuits are coupled to the least one bit line, The latch circuits latch data on the least one bit line. The local MAC circuit is coupled to the plurality of latch circuits. The local MAC circuit performs a first stage CIM operation on latched data latched in the plurality of latch circuits to provide a first stage CIM result. The global MAC circuit is coupled to the plurality of memory banks. The global MAC circuit is coupled to the plurality of memory banks performs a second stage CIM operation on a plurality of first stage CIM results from the plurality of memory banks.

In some embodiments, an operating method for CIM, comprises: latching, using a first latch circuit, a first data from a first memory array in a first read cycle; latching, using a second latch circuit, a second data from the first memory array in a second read cycle in a second read cycle different from the first read cycle; and performing a first CIM operation on at least one of a first latched data latched in the first latch circuit and a second latched data latched in the second latch circuit to provide a first CIM result.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device for computing in memory (CIM), comprising:
 a plurality of memory banks, each of the plurality of memory banks comprising:
  a first memory array;
  a first latch circuit, coupled to the first memory array, configured to latch a first data from the first memory array in a first read cycle;
  a second latch circuit, coupled to the first memory array, configured to latch a second data from the first memory array in a second read cycle; and
  a local multiply accumulate (MAC) circuit, coupled to the first latch circuit and the second latch circuit, configured to perform a first stage CIM operation on at least one of a first latched data latched in the first latch circuit and a second latched data latched in the second latch circuit to provide a first stage CIM result; and
 a global MAC circuit, coupled to the plurality of memory banks, configured to perform a second stage CIM operation on a plurality of first stage CIM results from the plurality of memory banks.

2. The memory device according to claim 1, wherein the first read cycle and the second read cycle are adjacent cycles of a memory clock.

3. The memory device according to claim 1, wherein the first latch circuit and the second latch circuit latch a same data in a same read cycle.

4. The memory device according to claim 1, wherein:
 the first memory array comprises least one bit line extended in a first direction, and
 the first latch circuit and the second latch circuit are arranged in a second direction different from the first direction.

5. The memory device according to claim 1, wherein:
 the first memory array comprises least one bit line extended in a first direction, and
 the first latch circuit and the second latch circuit are arranged in the first direction.

6. The memory device according to claim 1, wherein:
 the first memory array comprises least one bit line,
 each of the plurality of memory banks further comprises:
  a first switch, coupled between the first latch circuit and the least one bit line, configured to transmit the first data on the least one bit line to the first latch circuit in response to a first latch signal; and
  a second switch, coupled between the second latch circuit and the least one bit line, configured to transmit the second data on the least one bit line to the second latch circuit in response to a second latch signal.

7. The memory device according to claim 6, further comprising:
 a memory controller, configured to provide the first latch signal and the second latch signal.

8. The memory device according to claim 6, wherein the first switch is implemented by one of a transmission gate and a transistor.

9. The memory device according to claim 6, wherein the second switch is implemented by one of a transmission gate and a transistor.

10. The memory device according to claim 6, wherein the first switch and the second switch are located in a transition region in each of the plurality of memory banks.

11. The memory device according to claim 1, wherein each of the plurality of memory banks further comprising:
 a first logic circuit, coupled to the first latch circuit, configured to output the first latched data in response to a first input data; and
 a second logic circuit, coupled to the first latch circuit, configured to output the second latched data in response to a second input data.

12. The memory device according to claim 1, wherein the first logic circuit and the second logic circuit comprises a NOR logic circuit respectively.

13. The memory device according to claim 1, wherein each of the plurality of memory banks further comprising:
 a second memory array;
 a third latch circuit, coupled the second memory array, configured to latch a third data from the second memory array in a first read cycle; and
 a fourth latch circuit, coupled the second memory array, configured to latch a fourth data from the second memory array in a second read cycle,
 wherein the local MAC circuit performs the first stage CIM operation on at least one of the first latched data, the second latched data, a third latched data latched in the third latch circuit and a fourth latched data latched in the fourth latch circuit to provide the first stage CIM result.

14. A memory device for computing in memory (CIM), comprising:
 a plurality of memory banks, each of the plurality of memory banks comprising:
  a first memory array, comprising least one bit line;
  a plurality of latch circuits, coupled to the least one bit line, configured to latch data on the least one bit line; and
  a local multiply accumulate (MAC) circuit, coupled to the plurality of latch circuits, configured to perform a first stage CIM operation on latched data latched in the plurality of latch circuits to provide a first stage CIM result; and
 a global MAC circuit, coupled to the plurality of memory banks, configured to perform a second stage CIM operation on a plurality of first stage CIM results from the plurality of memory banks.

15. The memory device according to claim 1, wherein:
 the first latch circuit among the plurality of latch circuits latches a first data in a first read cycle, and
 the second latch circuit among the plurality of latch circuits latches a second data in a second read cycle different from the first read cycle.

16. The memory device according to claim 15, wherein each of the plurality of memory banks further comprises:
 a first switch, coupled between the first latch circuit and the least one bit line, configured to transmit the first data on the least one bit line to the first latch circuit in response to a first latch signal; and
 a second switch, coupled between the second latch circuit and the least one bit line, configured to transmit the second data on the least one bit line to the second latch circuit in response to a second latch signal.

17. The memory device according to claim 14, wherein each of the plurality of memory banks further comprising:
 a plurality of logic circuits, coupled to the plurality of latch circuits in one-by-one manner, configured to output latched data latched by a corresponding latch circuit among the plurality of latch circuits respectively.

18. An operating method for computing-in-memory (CIM) of a memory device, wherein the memory device comprises a plurality of memory banks and a global multiply accumulate (MAC) circuit, wherein each of the plurality of memory banks comprises first memory array, a first latch circuit, a second latch circuit and a local MAC circuit, wherein the operating method comprises:

latching, using the first latch circuit, a first data from the first memory array in a first read cycle;

latching, using the second latch circuit, a second data from the first memory array in a second read cycle in a second read cycle different from the first read cycle;

performing, using the local MAC circuit, a first stage CIM operation on at least one of a first latched data latched in the first latch circuit and a second latched data latched in the second latch circuit to provide a first CIM result; and performing, using the global MAC circuit, a second stage CIM operation on a plurality of first stage CIM results from the plurality of memory banks.

19. The operating method according to claim 18, wherein each of the plurality of memory banks further comprises a second memory array, a third latch circuit and a fourth latch circuit, wherein the operating method further comprises:

latching, using the third latch circuit, a third data from the second memory array in the first read cycle;

latching, using the fourth latch circuit, a fourth data from the second memory array in the second read cycle; and performing a first stage CIM operation on at least one of a third latched data latched in the third latch circuit and a fourth latched data latched in the fourth latch circuit to provide a second CIM result.

20. The operating method according to claim 18, wherein each of the plurality of memory banks further comprises a first logic circuit and a second logic circuit, wherein the operating method further comprises:

outputting, using the first logic circuit, the first latched data in response to a first input data; and outputting, using the second logic circuit, the second latched data in response to a second input data.

* * * * *